(12) United States Patent
Nie et al.

(10) Patent No.: US 10,408,859 B2
(45) Date of Patent: Sep. 10, 2019

(54) TEST FIXTURE AND TESTING DEVICE HAVING THE SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Xiao-Jun Nie, Shenzhen (CN); Fei-Fen Xu, Shenzhen (CN); Wen-Ping Wang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 99 days.

(21) Appl. No.: 15/860,684

(22) Filed: Jan. 3, 2018

(65) Prior Publication Data
US 2019/0128921 A1 May 2, 2019

(30) Foreign Application Priority Data
Oct. 31, 2017 (CN) .......................... 2017 1 1048152

(51) Int. Cl.
*G01R 31/00* (2006.01)
*G01R 1/04* (2006.01)
*G01R 31/28* (2006.01)

(52) U.S. Cl.
CPC ....... *G01R 1/0433* (2013.01); *G01R 31/2893* (2013.01)

(58) Field of Classification Search
CPC ....... B07C 5/10; B07C 5/3422; B07C 5/3425; B07C 3/00; B07C 3/08; B07C 5/344; B07C 3/082; B07C 5/00; B07C 5/02; B07C 5/34; B07C 5/366; B07C 1/16; B07C 5/3412; B07C 5/38; B07C 1/00; B07C 5/122; B07C 5/342; B07C 5/36; B07C 1/04; B07C 1/14; B07C 1/20; B07C 2501/0009; B07C 3/02; B07C 3/16; B07C 5/04; B07C 5/346; B07C 7/00; B65G 2201/0229; B65G 47/5113;
(Continued)

(56) References Cited

U.S. PATENT DOCUMENTS 4,186,836 A * 2/1980 Wassmer .............. B07C 5/3422
209/565
6,469,496 B1 * 10/2002 Khouw .............. G01R 31/2887
209/573
(Continued)

*Primary Examiner* — Vinh P Nguyen
(74) *Attorney, Agent, or Firm* — ScienBiziP, P.C.

(57) ABSTRACT

A test fixture automatically placing an electronic device for testing includes a carrying module for holding the electronic device, a cover board module for supporting the carrying module, and a test module. The cover board module has an inductor for sensing the placement on the carrying module of the electronic device. The test module includes a driving member, a test plug connected to the driving member, a detector electronically connected to test plug, and an adapter movably positioned on the carrying module. The adapter includes a patch plug and a socket. When the inductor signals that the electronic device is on the carrying module, the test plug is driven into the socket of the adapter, and the patch plug of the adapter is further driven into the electronic device, to begin the testing procedure. A testing device having the test fixture is also provided.

20 Claims, 6 Drawing Sheets

(58) Field of Classification Search
CPC ........ B65G 27/00; B65G 27/04; B65G 27/24; B65G 47/90; B65G 61/00; G01R 31/01; G01R 31/2851; G01R 31/2893; G01R 31/016; G01R 31/2635; G01R 31/2806; G01R 31/2808; G01R 31/2887; G01R 31/3277; G01T 1/167; G01T 7/08
See application file for complete search history.

(56) References Cited

U.S. PATENT DOCUMENTS

| | | | | |
|---|---|---|---|---|
| 6,856,128 | B2* | 2/2005 | Ito | G01R 31/2893 324/750.13 |
| 8,281,917 | B1* | 10/2012 | Bowie | G01R 31/01 198/346.1 |

* cited by examiner

TEST FIXTURE AND TESTING DEVICE HAVING THE SAME

CROSS-REFERENCE TO RELATED APPLICATIONS

This application claims priority to Chinese Patent Application No. 201711048152.9 filed on Oct. 31, 2017, the contents of which are incorporated by reference herein.

FIELD

The subject matter herein generally relates to a testing device, especially related to a test fixture with automatic detection and a testing device having the same.

BACKGROUND

When an electronic device needs to be put on a tray for properties test, the station is operated manually. However, the manual operation brings higher labor cost and lower production efficiency.

BRIEF DESCRIPTION OF THE DRAWINGS

Implementations of the present technology will now be described, by way of example only, with reference to the attached figures.

DETAILED DESCRIPTION OF EMBODIMENTS

Figure 1:
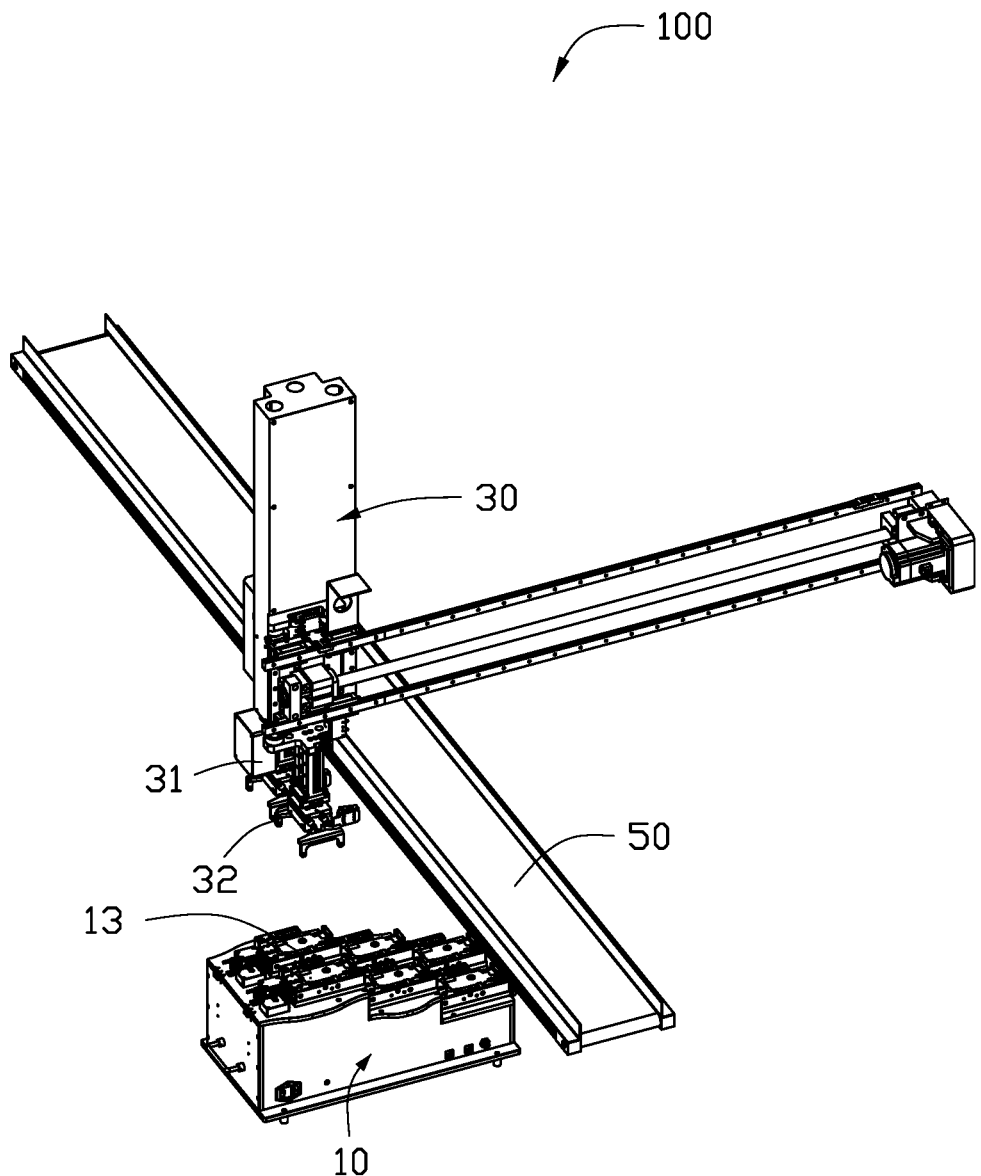
FIG. 1 is an assembled, isometric view of a testing device in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not to be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Referring to FIG. 1, a testing device 100 of an exemplary embodiment of the present disclosure includes a test fixture 10 configured to test the properties of an electronic device (not shown), a transport assembly 30, a conveyor 50, and a controller (not shown). The conveyor 50 is configured to transfer the electronic device to the transport assembly 30. The transport assembly 30 is configured to transport the electronic device to the test fixture 10 for testing. After testing, the transport assembly 30 transports the electronic device to the conveyor 50, and the conveyor 50 transfers the tested electronic device away from the test fixture 10. The electronic device may be any electronic device. The controller is electronically connected to the test fixture 10, the transport assembly 30, and the conveyor 50. The controller is configured to control the test fixture 10 to test the electronic device, control the transport assembly 30 to transport the electronic device, and control the conveyor 50 to transfer the electronic device.

Figure 2:
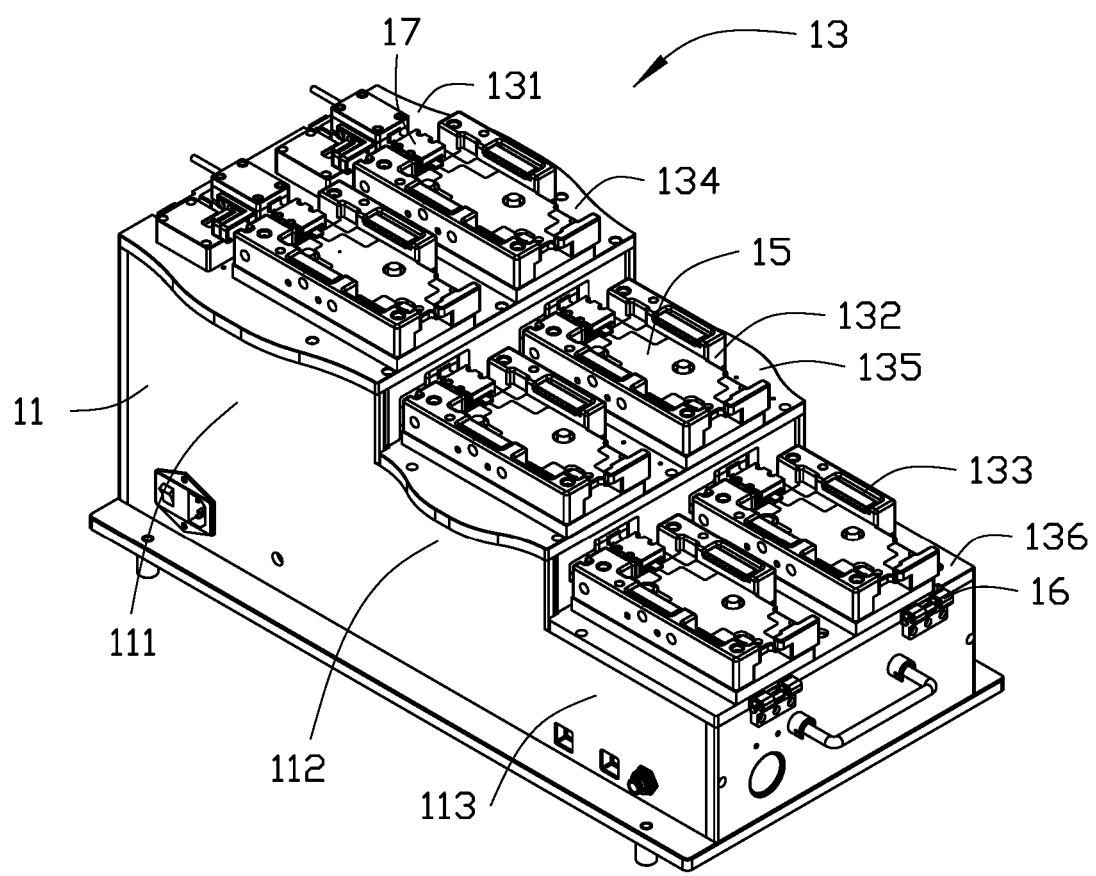
FIG. 2 is an assembled, isometric view of a test fixture of the testing device shown in FIG. 1.
Figure 3:
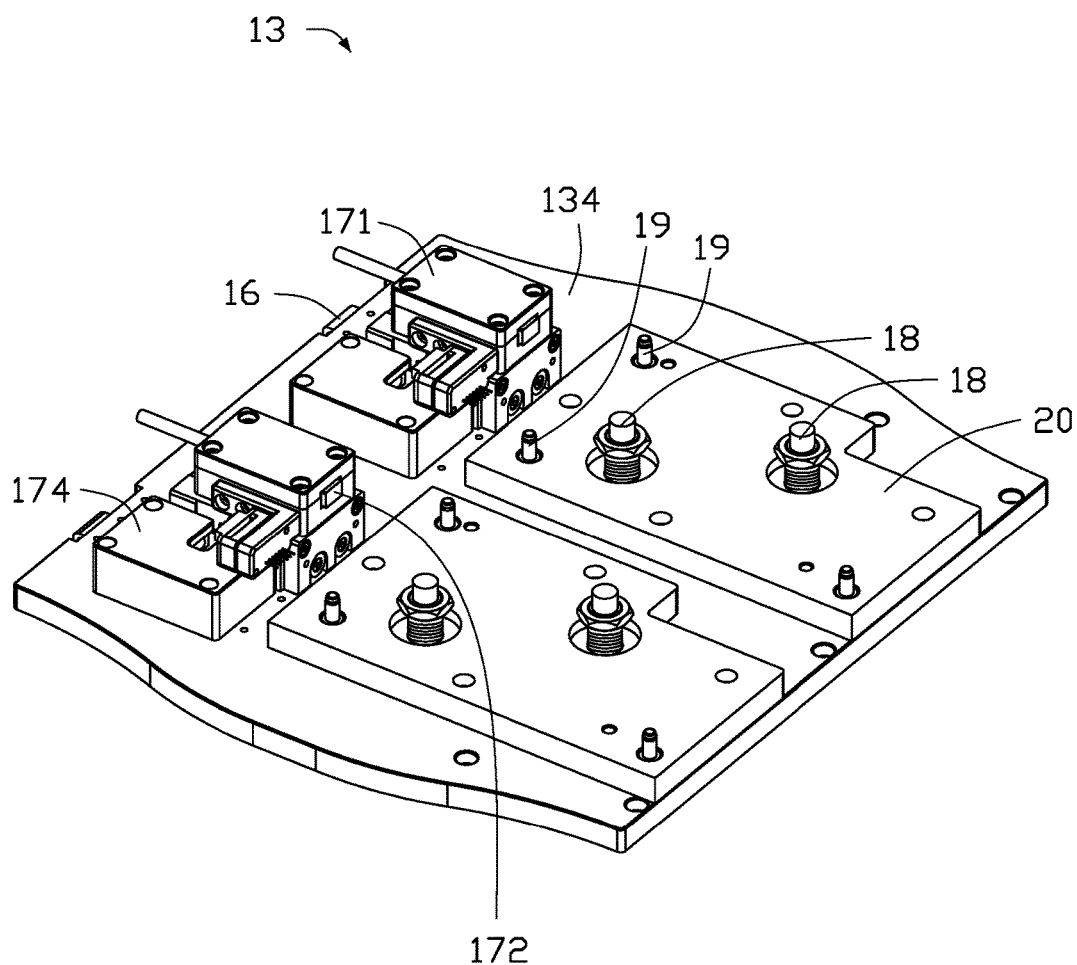
FIG. 3 is an assembled, isometric view of a cover board module of the test fixture shown in FIG. 2.

Referring to FIG. 2 and FIG. 3, the test fixture 10 includes a main body 11, at least one cover board module 13, at least one carrying module 15, and at least one test module 17. The cover board module 13 is positioned on the main body 11. The carrying module 15 is positioned on the cover board module 13 for holding the electronic device. The test module 17 is positioned on the cover board module 13 and faces the carrying module 15 during testing.

The main body 11 is designed with a stepped structure, such that full use can be made of an inner space of the test fixture 10. A number of steps of the main body 11 ma be one or at least two. In this exemplary embodiment, the number of the steps is three. The steps are labeled as a first step 111, a second step 112, and a third step 113, in that order from a top to a bottom of the main body 11. The first step 111, the second step 112, and the third step 113 are parallel to each other.

A number of the cover board modules 13 is equal to the number of the steps. In this exemplary embodiment, the number of the cover board modules 13 is three. The cover board modules 13 are labeled as a first cover board module 131, a second cover board module 132, and a third cover board module 133. Each cover board module 13 includes a cover board. The three cover boards are labeled as a first cover board 134, a second cover board 135, and a third cover board 136, corresponding to the first cover board module 131, the second cover board module 132, and the third cover board module 133. The first cover board 134, the second cover board 135 and the third cover board 136 are respectively located on the first step 111, the second step 112, and the third step 113.

Each cover board module 13 further includes a hinge 16 positioned at an end of the cover board. The hinges 16 are configured to rotatably couple the cover boards to the steps. The first cover board 134 is rotatably disposed at an end of the first step 111 away from the second step 112 through one of the hinges 16. The second cover board 135 is rotatably disposed at an end of the second step 112 close to the first step 111 through one of the hinges 16. The third cover board 136 is rotatably disposed at an end of the third step 113 away from the second step 112 through one of the hinges 16. A rotation direction of the first and second cover boards 134 and 135 is the same, a rotation direction of the third cover board 136 is the opposite.

Each cover board module 13 further includes at least one supporting board 20 positioned on the cover board. The supporting board 20 is substantially L shaped. In this exemplary embodiment, the test fixture 10 includes six supporting boards 20. The six supporting boards 20 are parallel. The six supporting boards 20 are divided into three groups with two of the supporting boards 20 in each group. The three groups of the supporting boards 20 are respectively positioned on the first cover board 134, the second cover board 135, and the third cover board 136.

Each supporting board 20 is provided with at least one inductor 18 and at least one positioning mast 19 positioned thereon. In this exemplary embodiment, a number of the positioning masts 19 positioned on each supporting board 20 is three, and a number of the inductors 18 positioned on each supporting board 20 is two. The positioning masts 19 are configured to position the carrying module 15. The inductors 18 are configured to sense when an electronic device is placed onto the carrying module 15. The inductor 18 may be an optical sensor or a pressure sensor.

Figure 4:
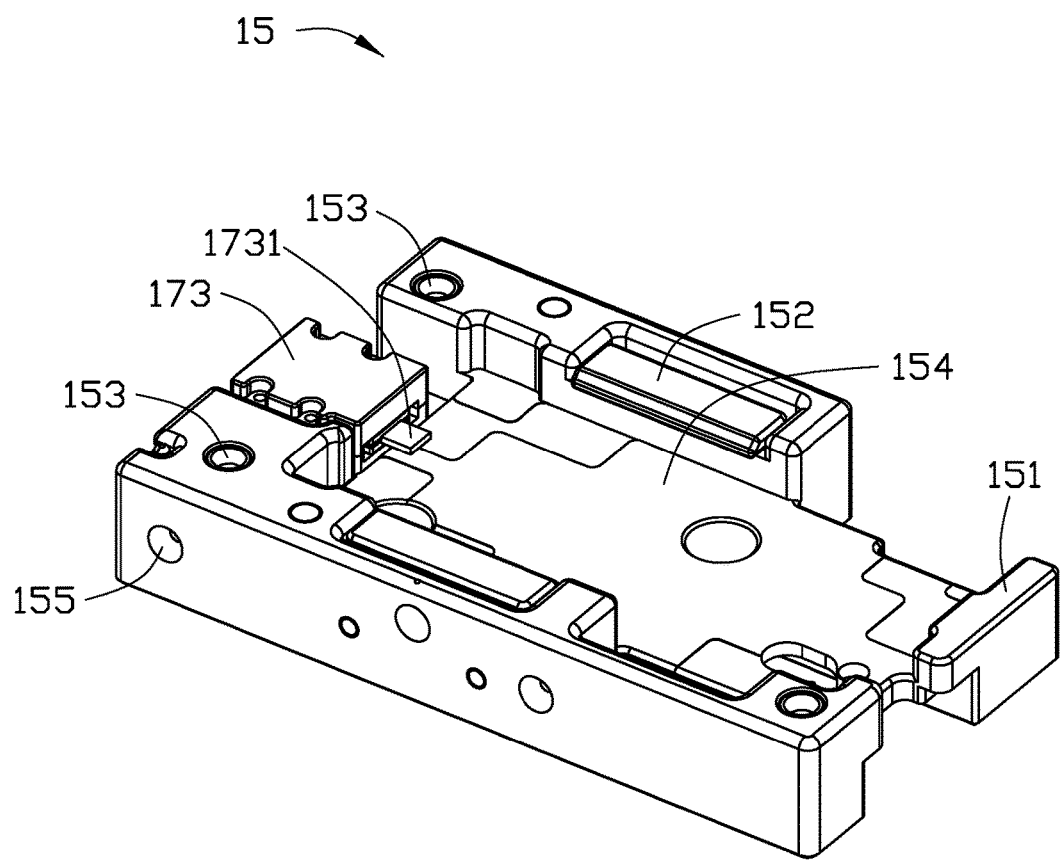
FIG. 4 is an assembled, isometric, front view of a carrying module of the test fixture shown in FIG. 2.
Figure 5:
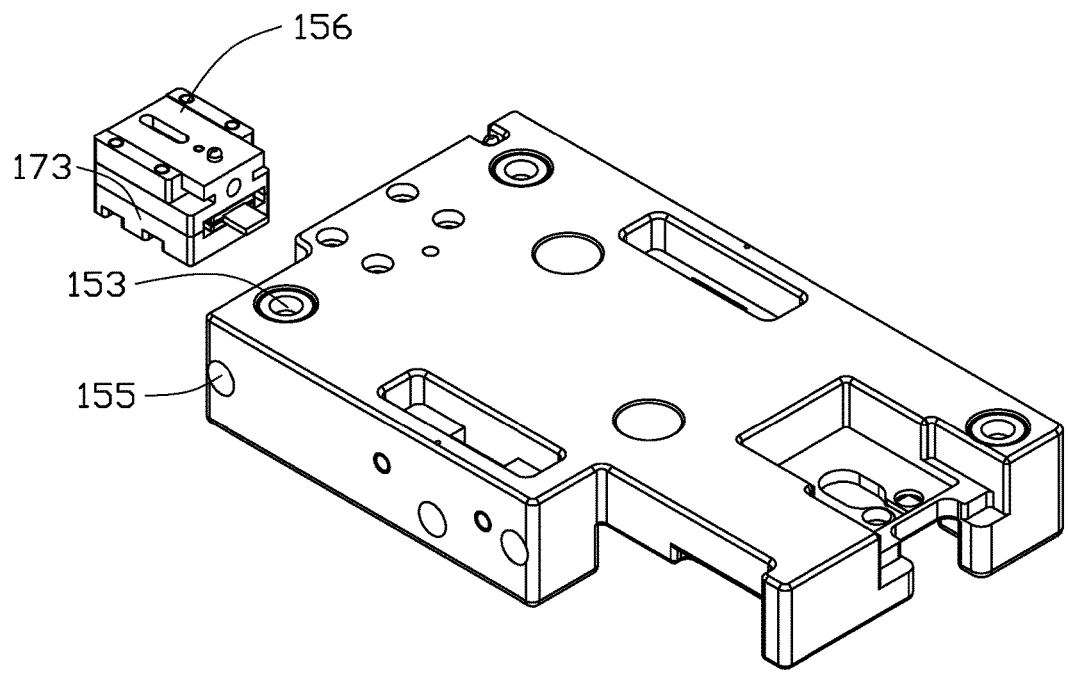
FIG. 5 is a partially exposed, isometric, rear view of the carrying module shown in FIG. 4.
Figure 6:
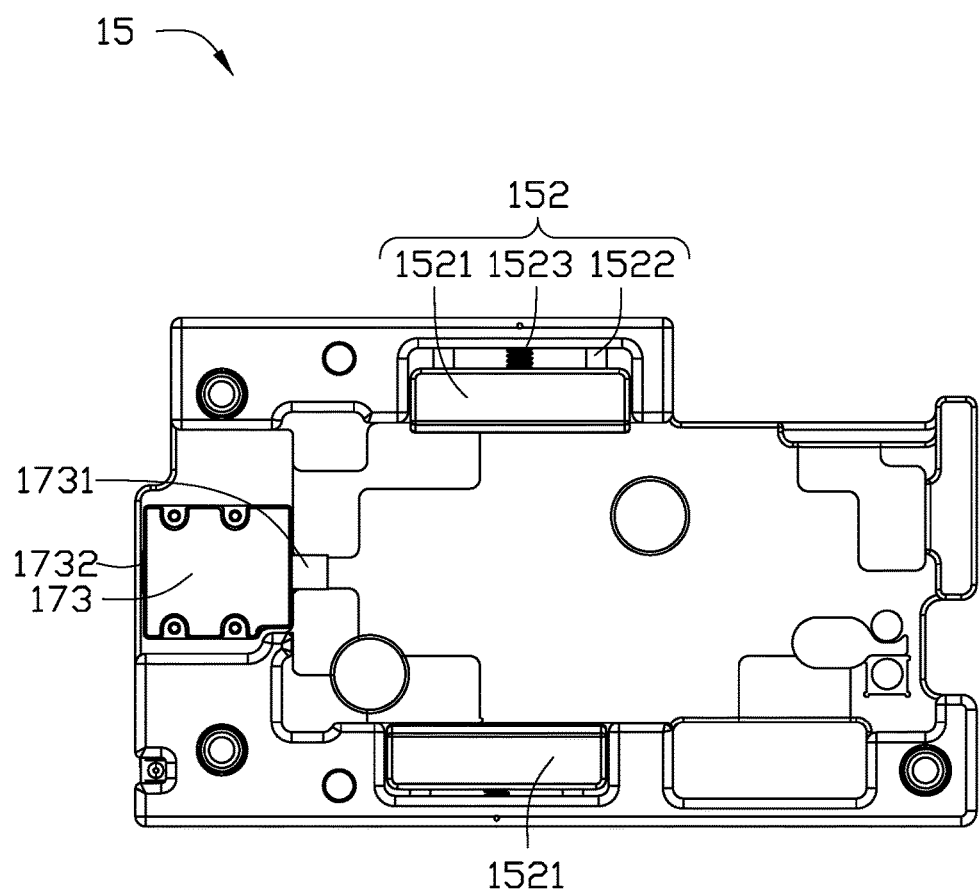
FIG. 6 is a plan view of the carrying module shown in FIG. 4, holding an electronic device for testing.

Referring to FIGS. 4-6, a number of the carrying modules 15 is equal to a number of the supporting boards 20. Each carrying module 15 is detachably positioned on the corresponding supporting board 20. Each carrying module 15 includes a tray 151 and at least two clamping modules 152. A shape of the tray 151 is similar to a shape of the supporting board 20, and dimensions of the tray 151 are similar to dimensions of the supporting board 20. The tray 151 is detachably positioned on the supporting board 20 for holding the electronic device. The clamping modules 152 are located on the tray 151 for clamping the electronic device.

At least one positioning hole 153 and a cavity 154 are defined on the tray 151. A number of the positioning holes 153 is equal to the number of the positioning masts 19 positioned on each supporting board 20. In this exemplary embodiment, a number of the positioning holes 153 is three. Each positioning hole 153 is used for holding the corresponding positioning mast 19. The cavity 154 is used for receiving the electronic device. An area of the cavity 154 is slightly larger than an area of the electronic device.

In this exemplary embodiment, each carrying module 15 includes two clamping modules 152. The two clamping modules 152 are symmetrically located at opposite sides of the cavity 154 to clamp the electronic device received in the cavity 154.

Each clamping module 152 includes a resisting member 1521, at least one guiding member 1522, and at least one elastic member 1523. In this exemplary embodiment, each clamping module 152 includes two guiding members 1522 and one elastic member 1523. The elastic member 1523 is positioned between the two guiding members 1522. One end of each guiding member 1522 is fixed on the tray 151, and the other end of the guiding member 1522 passes through the resisting member 1521, such that the resisting member 1521 can move along the guiding member 1522. The elastic member 1523 is positioned between the tray 151 and the resisting member 1521. One end of the elastic member 1523 is fixed on the tray 151, and the other end of the elastic member 1523 is fixed on the resisting member 1521. When the electronic device is positioned in the cavity 154, the two elastic members 1523 of the two clamping modules 152 are compressed, and the electronic device is clamped by the two resisting members 1521 of the two clamping modules 152 under the elastic force of the two elastic members 1523.

A plurality of fetching holes 155 is defined on a side surface of the tray 151. The fetching holes 155 are configured to cooperate with the transport assembly 30 to transport the electronic device.

Each carrying module 15 further includes a locking pin 156. The locking pin 156 is fixed on the tray 151 and is close to the cavity 154.

Referring to FIGS. 3-6, a number of the test modules 17 is equal to a number of the carrying modules 15. Each test module 17 includes a detector 171, a test plug 172, an adapter 173, and a driving member 174. The detector 171 and the driving member 174 are positioned on the cover board of the cover board module 13. The test plug 172 is electronically connected to the detector 171 and coupled with the driving member 174. The driving member 174 can drive the test plug 172 to move toward or away from the adapter 173. The driving member 174 may be a cylinder. The adapter 173 is movably positioned on the tray 151. Specifically, the adapter 173 is coupled with the locking pin 156 of the carrying module 15 and can be driven to move relative to the locking pin 156. The adapter 173 includes a patch plug 1731 and a socket 1732. The test plug 172 can be inserted into the socket 1732 when driven by the driving member 174, and the patch plug 1731 of the adapter 173 can be inserted into the electronic device when driven by the test plug 172 and the driving member 174.

Referring to FIG. 1 and FIG. 4, the conveyor 50 is located beside the test fixture 10. The conveyor 50 may be a belt conveyor, a chain conveyor, or other conveying means. In this exemplary embodiment, the conveyor 50 is a belt conveyor.

The transport assembly 30 is located upon the test fixture 10 and the conveyor 50. The transport assembly 30 includes a transfer arm 31 and a clamping jaw 32. The transfer arm 31 can be driven to move in any of three directions, and each direction is perpendicular to the others. The clamping jaw 32 is positioned on a bottom of the transfer arm 31 and can move along with the transfer arm 31. The clamping jaw 32 is configured to couple with the fetching hole 155 of the tray 51, such that the clamping jaw 32 can fetch and transport the carrying module 15 with the electronic device held therein, The testing device 100 is operated as below.

The carrying modules 15 with the electronic devices held n place are placed on the conveyor 50. The carrying modules 15 and the electronic devices are transferred by the conveyor 50 to the transfer arm 31. The transfer arm 31 drives the clamping jaw 32 to fetch the carrying modules 15 in order and transport the carrying modules 15 to the cover boards of the cover board modules 13. When the carrying modules 15 are positioned on the supporting boards 20, the inductor 18 senses whether the electronic device is placed onto the corresponding carrying module 15 and sends signal accordingly to the controller. When the inductor 18 senses that the electronic device is accommodated onto the carrying module 15, the controller controls the driving member 174 to drive the test plug 172 toward the adapter 173, such that the test plug 172 is inserted into the adapter 173, and the adapter 173 is inserted into the electronic device. Then, the detector 171 begins the testing. After testing, the clamping jaw 32 fetches the carrying modules 15 positioned on the cover board modules 13 and then transports the carrying modules 15 to the conveyor 50, and the carrying modules 15 are then transferred by the conveyor 50 to next station.

The embodiments shown and described above are only examples. Many details are often found in the art such as the other features of the test fixture. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A test fixture for testing at least one electronic device, the test fixture comprising:
   at least one carrying module for holding the at least one electronic device correspondingly;
   at least one cover board module for supporting the at least one carrying module correspondingly, each of the at least one cover board module comprising at least one inductor for sensing whether the at least one electronic device being placed onto the at least one carrying module; and
   at least one test module, each of the at least one test module comprising:
     a driving member electronically coupled with the inductor;
     a test plug connected to the driving member;
     a detector electronically connected to the test plug; and
     an adapter movably positioned on the at least one carrying module;
   wherein the adapter comprises a patch plug and a socket, when the at least one inductor signals that the at least one electronic device is on the at least one carrying module, the test plug is driven by the driving member to insert into the socket of the adapter, and the patch plug of the adapter is further driven by the test plug and the driving member to insert into the at least one electronic device for testing properties of the at least one electronic device.

2. The test fixture of claim 1, wherein each of the at least one cover board module further comprises a cover board, a supporting board positioned on the cover board, and at least one positioning mast positioned on the supporting board; the driving member is positioned on the cover board, the at least one inductor is positioned on the supporting board, and the at least one positioning mast is configured for positioning the at least one carrying module.

3. The test fixture of claim 2, wherein each of the at least one carrying module comprises a tray, at least one positioning hole and a cavity are defined on the tray, the at least one positioning mast is held in the at least one positioning hole for positioning the at least one carrying module, and the cavity is used for receiving the at least one electronic device.

4. The test fixture of claim 3, wherein the adapter is positioned on the tray, a locking pin is provided on the tray, the adapter is coupled with the locking pin and is capable of being driven to move relative to the locking pin.

5. The test fixture of claim 4, wherein each of the at least one carrying module further comprises two clamping modules, the two clamping modules are symmetrically located at opposite sides of the cavity to clamp the at least one electronic device received in the cavity.

6. The test fixture of claim 5, wherein each of the clamping modules comprises a resisting member, at least one guiding member, and at least one elastic member; one end of the guiding member is fixed on the tray, and the other end of the guiding member passes through the resisting member; one end of the elastic member is fixed on the tray, and the other end of the elastic member is fixed on the resisting member; when the at least one electronic device is positioned in the cavity, the two elastic members of the two clamping modules are compressed, and the at least one electronic device is clamped by the two resisting members of the two clamping modules under the elastic force of the two elastic members.

7. The test fixture of claim 2, further comprising a main body, wherein the main body is designed with a stepped structure, a number of the steps is equal to a number of the at least one cover board modules, each cover board of the at least one cover board module is rotatably positioned on the corresponding step.

8. The test fixture of claim 7, wherein each of the at least one cover board module is provided with a hinge positioned at an end of the cover board, the cover board is rotatably disposed at an end of the corresponding step through the hinge.

9. The test fixture of claim 8, wherein the number of the steps is three; the steps are labeled as a first step, a second step, and a third step in an order which is from a top of the main body to a bottom of the main body; the three cover boards are labeled as a first cover board, a second cover board, and a third cover board, corresponding to the first step, the second step, and the third step; the first cover board is rotatably disposed at an end of the first step away from the second step, the second cover board is rotatably disposed at an end of the second step close to the first step, the third cover board is rotatably disposed at an end of the third step away from the second step; a rotation direction of the first and second cover board is the same, and a rotation direction of the third cover board is the opposite.

10. The testing device of claim 9, further comprising a conveyor;
   wherein the conveyor is located beside the test fixture, the transport assembly is located upon the test fixture and the conveyor, the conveyor is configured to transfer the at least one carrying module with the at least one electronic device held therein to the transport assembly.

11. A testing device for testing at least one electronic device, the testing device comprising:
   a test fixture comprising:
     at least one carrying module for holding the at least one electronic device correspondingly;
     at least one cover board module for supporting the at least one carrying module correspondingly, each of the at least one cover board module comprising at least one inductor for sensing whether the at least one electronic device being placed onto the at least one carrying module; and
     at least one test module, each of the at least one test module comprising:
       a driving member electronically coupled with the inductor;
       a test plug connected to the driving member;
       a detector electronically connected to the test plug; and
       an adapter movably positioned on the at least one carrying module;
     wherein the adapter comprises a patch plug and a socket, when the at least one inductor signals that the at least one electronic device is on the at least one carrying module, the test plug is driven by the driving member to insert into the socket of the adapter, and the patch plug of the adapter is further driven by the test plug and the driving member to insert into the at least one electronic device for testing properties of the at least one electronic device.

12. The testing device of claim 11, wherein the adapter comprises a patch plug and a socket, when the at least one inductor signals that the at least one electronic device is on the at least one carrying module, the test plug is driven by the driving member to insert into the socket of the adapter, and the patch plug of the adapter is further driven by the test plug and the driving member to insert into the at least one electronic device for testing properties of the at least one electronic device.

13. The testing device of claim 12, wherein each of the at least one carrying module comprises a tray, at least one positioning hole and a cavity are defined on the tray, the at least one positioning mast is held in the at least one positioning hole for positioning the at least one carrying module, and the cavity is used for receiving the at least one electronic device.

14. The testing device of claim 13, wherein the adapter is positioned on the tray, a locking pin is provided on the tray, the adapter is coupled with the locking pin and is capable of being driven to move relative to the locking pin.

15. The testing device of claim 14, wherein each of the at least one carrying module further comprises two clamping modules, the two clamping modules are symmetrically located at opposite sides of the cavity to clamp the at least one electronic device received in the cavity.

16. The testing device of claim 15, wherein each of the clamping modules comprises a resisting member, at least one guiding member, and at least one elastic member; one end of the guiding member is fixed on the tray, and the other end of the guiding member passes through the resisting member; one end of the elastic member is fixed on the tray, and the other end of the elastic member is fixed on the resisting member; when the at least one electronic device is positioned in the cavity, the two elastic members of the two clamping modules are compressed, and the at least one electronic device is clamped by the two resisting members of the two clamping modules under the elastic force of the two elastic members.

17. The testing device of claim 12, further comprising a main body, wherein the main body is designed with a stepped structure, a number of the steps is equal to a number of the at least one cover board modules, each cover board of the at least one cover board module is rotatably positioned on the corresponding step.

18. The testing device of claim 17, wherein each of the at least one cover board module is provided with a hinge positioned at an end of the cover board, the cover board is rotatably disposed at an end of the corresponding step through the hinge.

19. The testing device of claim 18, wherein the number of the steps is three; the steps are labeled as a first step, a second step, and a third step in an order which is from a top of the main body to a bottom of the main body; the three cover boards are labeled as a first cover board, a second cover board, and a third cover board, corresponding to the first step, the second step, and the third step; the first cover board is rotatably disposed at an end of the first step away from the second step, the second cover board is rotatably disposed at an end of the second step close to the first step, the third cover board is rotatably disposed at an end of the third step away from the second step; a rotation direction of the first and second cover board is the same, and a rotation direction of the third cover board is the opposite.

20. The testing device of claim 11, further comprising a transport assembly;
wherein transport assembly comprises a transfer arm and a clamping jaw positioned on a bottom of the transfer arm, the clamping jaw can be driven to move along with the transfer arm to fetch and transport the at least one carrying module with the at least one electronic device held therein.

* * * * *